US008344613B2

United States Patent
Tanaka

(10) Patent No.: US 8,344,613 B2
(45) Date of Patent: Jan. 1, 2013

(54) ORGANIC ELECTROLUMINESCENCE DISPLAY DEVICE

(75) Inventor: Masahiro Tanaka, Chiba (JP)

(73) Assignees: Hitachi Displays Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 452 days.

(21) Appl. No.: 12/216,788

(22) Filed: Jul. 10, 2008

(65) Prior Publication Data
US 2009/0026941 A1 Jan. 29, 2009

(30) Foreign Application Priority Data
Jul. 12, 2007 (JP) .................................. 2007-183284

(51) Int. Cl.
*H01J 1/62* (2006.01)
(52) U.S. Cl. ....................................................... 313/504
(58) Field of Classification Search ........... 313/502–506
See application file for complete search history.

(56) References Cited

U.S. PATENT DOCUMENTS

| 2005/0104084 A1* | 5/2005 | Itai et al. ........................ 257/103 |
| 2005/0122038 A1* | 6/2005 | Kinoshita et al. ............. 313/504 |
| 2006/0040131 A1* | 2/2006 | Klubek et al. ................. 428/690 |
| 2006/0258043 A1* | 11/2006 | Bold et al. ........................ 438/99 |
| 2007/0170847 A1 | 7/2007 | Kumaki et al. |
| 2008/0030131 A1* | 2/2008 | Duarte et al. ................. 313/506 |
| 2008/0191611 A1 | 8/2008 | Iwaki et al. |

FOREIGN PATENT DOCUMENTS

| JP | 2006-156997 | 11/2005 |
| JP | 2006303470 A | 11/2006 |

* cited by examiner

*Primary Examiner* — Anh Mai
*Assistant Examiner* — Brenitra M Lee
(74) *Attorney, Agent, or Firm* — Stites & Harbison, PLLC; Juan Carlos A. Marquez, Esq.; Nicholas B. Trenkle

(57) ABSTRACT

The invention provides an organic electroluminescence display device that makes it possible to obtain a highly reliable display. The organic electroluminescence display device has an organic electroluminescence element that includes a first layer (3) that contains a first substance that exhibits electron transport properties, and a second substance that exhibits electron-donating properties with respect to the first substance; a second layer (4) that is composed of a third substance that exhibits hole transport properties; a third layer (light-emitting layer (5)) that contains a light-emitting substance; and a fourth layer (6) that is formed from a substance that exhibits electron transport properties.

6 Claims, 6 Drawing Sheets

ORGANIC ELECTROLUMINESCENCE DISPLAY DEVICE

CROSS-REFERENCE TO RELATED APPLICATION

The present application claims priority from Japanese application JP2007-183284 filed on Jul. 12, 2007, the content of which is hereby incorporated by reference into this application.

BACKGROUND OF THE INVENTION

1. Field of the Invention

The present invention relates to an organic electroluminescence display device in which an electric field is applied to an organic electroluminescence element provided with an organic electroluminescence layer between a pair of electrodes to cause to emit light, and particularly relates to a layered structure of an organic electroluminescence element.

2. Description of the Related Art

Liquid crystal display devices (LCD), plasma display devices (PDP), field emission displays (FED), organic electroluminescence display devices (OLED), and the like are currently either in practical use or in the research stage for practical use as flat panel display devices. Among these, organic electroluminescence display devices are display devices having considerable promise as typical future self-illuminating display devices that are thin and lightweight. There are so-called bottom emission and top emission types of organic electroluminescence display devices.

In a bottom emission organic electroluminescence display device, an organic electroluminescence element is configured having a light-emitting structure in which a transparent electrode as a first electrode or as one electrode, an organic electroluminescence layer (also called an organic multilayer film) that emits light by the application of an electric field, and a reflective metallic electrode as a second electrode or another electrode are sequentially layered on a transparent substrate for which a glass substrate is preferably used. Numerous such organic electroluminescence elements are arrayed in the shape of a matrix and sealed by an insulating substrate, also called a sealed can, and the light-emitting structure is isolated from the external atmosphere.

Carriers (electrons and positive holes) are then injected into the organic electroluminescence layer, and the organic electroluminescence layer is caused to emit light by application of an electric field between the two electrodes in which, e.g., a transparent electrode is an anode and a reflective metallic electrode is a cathode. The emitted light departs from the transparent substrate to the exterior.

By contrast, in a top-emission organic electroluminescence display device, an organic electroluminescence layer is caused to emit light by application of an electric field between two electrodes, wherein one of the electrodes described above is a reflective metallic electrode, and the other electrode is a transparent electrode. The emitted light is emitted from the other electrode (transparent electrode) described above. A transparent substrate is used as a sealed can in a top emission display device.

In relation to this type of organic electroluminescence display device, the configuration of the electron injection side in which the layer structure of the organic electroluminescence element is formed in the sequence of an anode, a hole injection layer, a hole transport layer, and a light-emitting layer is disclosed in Japanese Laid-open Patent Publication No. 2006-156997.

Specifically, an organic electroluminescence element is disclosed in which an organic electroluminescence structure having a hole injection electrode, an electron injection electrode, and an organic layer that includes one or more types of light-emitting layers disposed between the electrodes is accommodated in an airtight case; one or more types of calcium hydride, strontium hydride, barium hydride, and aluminum hydride are placed in the airtight case; and the electron injection electrode contains one or more types of either alkali metal and either alkaline-earth metal.

Additionally, although there is a description in Japanese Laid-open Patent Publication No. 2006-156997 stating that an alkali metal may be contained in the electron transport layer and the light-emitting layer, there is no description that alkali metal is contained in the hole injection layer. Furthermore, although there is a concept related to a carrier generation layer in Japanese Laid-open Patent Publication No. 2006-156997, only the layered structure between the electron transport layer and the cathode is disclosed, and no consideration whatsoever is given to the layered structure between the anode and the hole transport layer.

SUMMARY OF THE INVENTION

However, there are problems in this type of top-emission organic electroluminescence display device in that the transparent electrode formed on an organic electroluminescence layer is formed by sputtering for purposes of performance, and the organic electroluminescence layer is therefore readily damaged by the influence of electrons, ions, active oxygen, and the like during sputtering, light-emission voltage is therefore increased, and electric current-luminance efficiency is therefore reduced.

In order to correct such problems, $V_2O_5$ is vapor-deposited as a protective layer prior to the formation of the transparent electrode in top anode-type configurations. Also, an electron transport material heavily doped with cesium (Cs) is vapor-deposited as an electron injection layer in top cathode-type configurations.

However, electron injection can be successfully performed when the electron injection layer is used in the case that the lower electrode is formed by aluminum (Al), ITO (In—Ti—O), IZO (In—Zn—O), or the like in top anode-type configurations. Also, hole injection can be successfully performed when the lower electrode is formed by ITO, IZO, or the like in top cathode-type configurations. In contrast, problems occur when the lower electrode is formed by Al in that hole are difficult to inject, a light-emission voltage becomes markedly higher, burn-in having a fixed display pattern appears, and color irregularities occur.

Therefore, the present invention was contrived to solve the conventional problems described above, and an object thereof is to provide an organic electroluminescence display device in which a highly reliable display can be obtained that can withstand long-term usage and has less image pattern burn-in.

The organic electroluminescence display device according to the present invention for achieving the objects described above has an organic electroluminescence element that is provided with a first electrode, an organic electroluminescence layer having at least a four-layer structure formed on the first electrode, and a second electrode formed on the organic electroluminescence layer, the organic electroluminescence element comprising:

a first layer that is in contact with the first electrode and contains a first substance that exhibits electron transport properties, and a second substance that exhibits electron-donating properties with respect to the first substance;

a second layer that is in contact with the first layer and contains a third substance that exhibits hole transport properties;

a third layer that is in contact with the second layer and contains a light-emitting substance; and a fourth layer that is in contact with the third layer and contains a substance that exhibits electron transport properties.

The organic electroluminescence display device according to another aspect of the present invention preferably has a layer containing an element of the first group of the periodic table, the layer being disposed between the second electrode and the fourth layer.

The organic electroluminescence display device according to yet another aspect of the present invention preferably has a layer containing an element of the second group of the periodic table, the layer being disposed between the second electrode and the fourth layer.

The organic electroluminescence display device according to still another aspect of the present invention preferably has a layer containing the same substance as the first layer and is disposed between the second electrode and the fourth layer.

The organic electroluminescence display device according to yet another aspect of the present invention is preferably one in which the first electrode is in contact with an insulating substrate.

The organic electroluminescence display device according to still another aspect of the present invention is preferably one in which the second electrode is in contact with an insulating substrate.

The organic electroluminescence display device according to yet another aspect of the present invention is preferably one in which at least one electrode among the first electrode and the second electrode is formed using a transparent conductive substance.

The present invention is not limited to each of the configurations described above and the embodiments described below, and it is apparent that various modifications are possible without departing from the technical concept of the present invention.

In accordance with the present invention, an organic electroluminescence element having stable hole injection characteristics can be obtained. Therefore, a highly reliable display that can withstand long-term usage and has less image pattern burn-in can be obtained by using the organic electroluminescence display device as a display. Also, it is possible to obtain a display which has excellent color reproducibility and in which the tint of the light thus produced can be adjusted by the interference effect of light because the distance between the electrode and the light-emission plane can be adjusted.

DETAILED DESCRIPTION OF THE INVENTION

Specific embodiments of the present invention are described in detail below with reference to the drawings of the examples.

Embodiment 1

Figure 1:
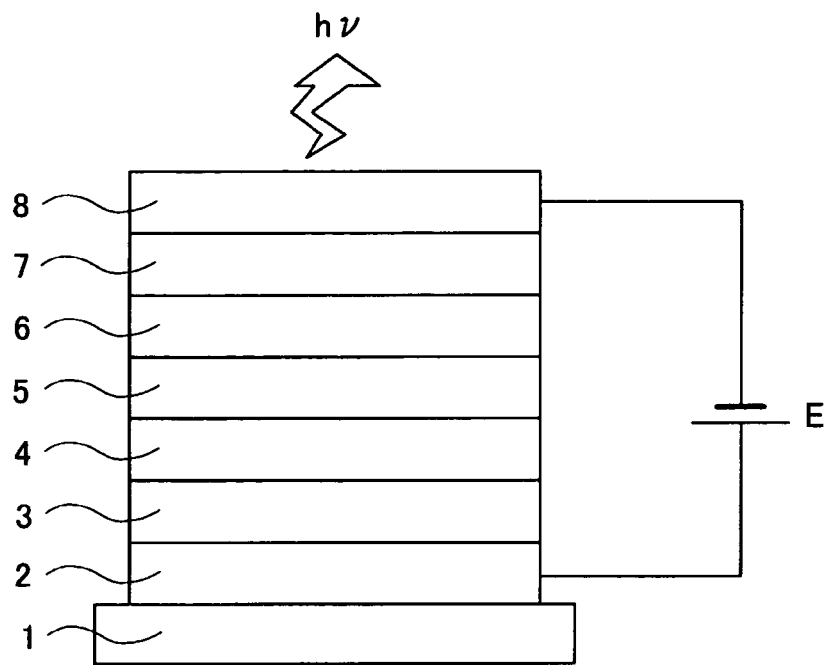
FIG. 1 is a partial enlarged cross-sectional view showing the configuration of the organic electroluminescence element for describing embodiment 1 of the organic electroluminescence display device according to the present invention.

FIG. 1 is a partial enlarged cross-sectional view showing a configuration of the organic electroluminescence element for describing embodiment 1 of the organic electroluminescence display device according to the present invention. In FIG. 1, a first layer 3 which has electron transport properties and electron-donating properties and in which a first substance having high electron transport properties, and a second substance having electron-donating properties with respect to the first substance, are formed as a film by vapor codeposition on a pixel anode 2, which is composed of vapor-deposited aluminum (Al) connected to a thin-film transistor for driving the organic electroluminescence element disposed on a glass substrate 1.

A second layer 4 is then formed on the first layer 3 using a third substance having high hole transport properties, and a third layer (light-emitting layer) 5 that contains a light-emitting substance is formed on the second layer 4. A fourth layer 6 is subsequently formed by vapor-depositing an electron transport material on the third layer 5, and a layer 7 having the same configuration as that of the first layer 3 is formed on the fourth layer 6, i.e., a layer 7 having electron transport properties and electron-donating properties is formed as a film by vapor codeposition of a first substance, which has high electron transport properties, and a second substance, which has electron-donating properties with respect to the first substance.

Lastly, the upper portion cathode 8 is formed on the layer 7 by IZO (In—Zn—O) sputtering to produce the organic electroluminescence element. ITO (In—Ti—O) may be substituted for IZO.

The thickness of each layer is as follows: the anode 2 composed of Al is about 200 nm, the first layer 3 is about 10 nm, the second layer 4 is about 60 nm, the third layer 5 is about 60 nm, the fourth layer 6 is about 10 nm, the layer 7 is about 40 nm, and the cathode 8 composed of IZO is about 40 nm.

In such a configuration, positive voltage is applied to the pixel anode 2 and negative voltage is applied to the upper portion cathode 8 from a power source E, whereby electric current flows inside of the organic electroluminescence layer, and the organic electroluminescence element emits light.

The first substance in the first layer 3 is not particularly limited provided that the substance exhibits electron transport properties and readily forms a charge transfer complex by vapor codeposition with an alkali metal. Examples that may be used include tris(8-quinolinolato) aluminum, tris(4-methyl-8-quinolinolato) aluminum, bis(2-methyl-8-quinolinolato)-4-phenylphenolate aluminum, bis[2-[2-hydroxyphenyl]benzoxazolate] zinc, and other metal complexes; and 2-(4-biphenylyl)-5-(4-tert-butylphenyl)-1,3,4-oxadiazole, 1,3-bis[5-p-tert-butylphenyl]-1,3,4-oxadiazole-2-yl] benzene and the like.

Additionally, the second substance in the first layer 3 is not particularly limited provided that the material exhibits electron-donating properties with respect to the electron transport material. Examples that may be selected and used as substances that exhibit electron-donating properties include lithium, cesium, and other alkali metals; magnesium, calcium, and other alkaline-earth metals; and furthermore, rare-earth metals and other metals or oxides, halides, and carbonates thereof.

Furthermore, the third substance used in the second layer 4 is a substance that exhibits hole transport properties, and examples that may be used include tetraaryl benzidine (triphenyl-diamine: TPD), aromatic tertiary amines, hydrazone derivatives, carbazole derivatives, triazole derivatives, imidazole derivatives, oxadiazole derivatives containing an amino group, polythiophene derivatives, and copper phthalocyanine derivatives. Additionally, the second layer 4 may be further divided in two; and $MoO_3$, $WO_3$, $V_2O_5$, and other inorganic materials may be used on the side that makes contact with the first layer 3.

The light-emitting material used in the third layer 5 is not particularly limited provided a substance in which a dopant that emits fluorescence or phosphorescence by recombination of electrons and holes is added to a host material provided with electron and hole transport properties, can be formed as a third layer 5 by vapor codeposition. Examples of the host include tris(8-quinolinolato) aluminum, bis(8-quinolinolato) magnesium, bis(benzo {f}-8-quinolinato) zinc, bis(2-methyl-8-quinolinolato) aluminum oxide, tris(8-quinolinolato) indium, tris(5-methyl-8-quinolinato) aluminum, 8-quinolinato lithium, tris(5-chloro-8-quinolinato) gallium, bis(5-chloro-8-quinolinolato) calcium, 5,7-dichloro-8-quinolinolato aluminum, tris (5,7-dibromo-8-hydroxyquinolinolato) aluminum, poly[zinc (II)-bis(8-hydroxy-5-quinolinyl) methane, and other complexes, anthracene derivatives, and carbazole derivatives.

The dopant is a substance that captures and recombines electrons and holes in the host and emits light, and examples that may be used include a pyran derivative for red, coumarin derivative for green, anthracene derivative for blue, or other fluorescent light-emitting substances; and an iridium complex, a pyridinate derivative, or other phosphorescent light-emitting substance.

An electron transport material is vapor-deposited to form the fourth layer 6. The material may be the first substance and the like used in the first layer 3.

The layer 7 is formed between the fourth layer 6 and the cathode 8 having the same configuration as the first layer 3. A layer of alkali metal or alkaline-earth metal, or a very thin layer of halogen oxide may be included. The layers function as an electron injection layer. A transparent conductive film such as ITO or IZO is used in the cathode 8 of the topmost layer in order to draw out the light.

Embodiment 2

Figure 2:
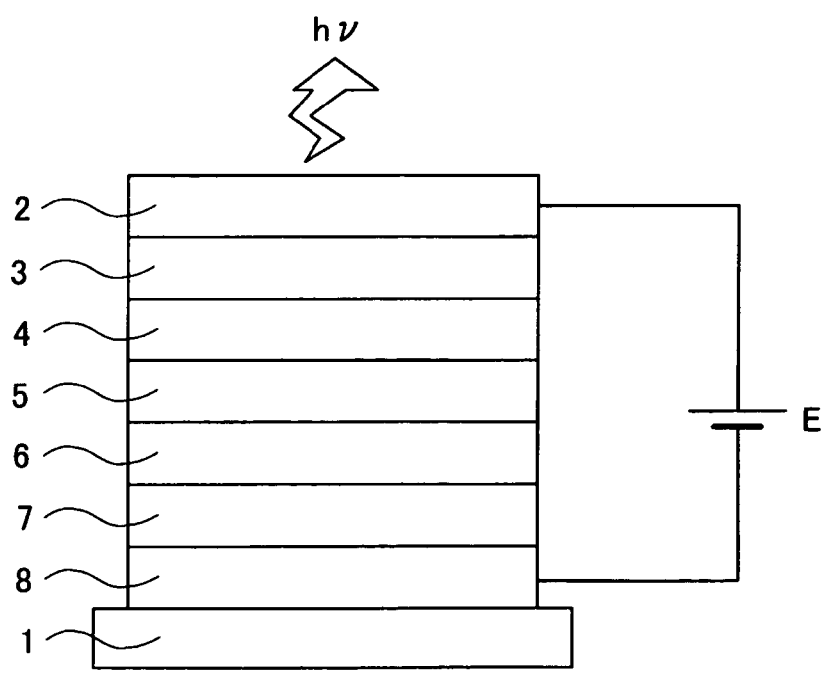
FIG. 2 is a partial enlarged cross-sectional view showing the configuration of the organic electroluminescence element for describing embodiment 2 of the organic electroluminescence display device according to the present invention.

FIG. 2 is a partial enlarged cross-sectional view showing the configuration of the organic electroluminescence element for describing the embodiment 2 of the organic electroluminescence display device according to the present invention. The same reference numerals are used for the same parts as in the drawings described above, and a description thereof will be omitted. In FIG. 2, the layer 7 which has electron transport properties and electron-donating properties and in which a first substance having electron transport properties, and a second substance having electron-donating properties with respect to the first substance, have been codeposited is formed on a pixel cathode 8, which is composed of an vapor-deposited aluminum connected to a thin-film transistor for driving the organic electroluminescence element disposed on a glass substrate 1.

A fourth layer 6 is then formed by vapor-depositing an electron transport material on the layer 7, and a third layer 5 containing a light-emitting substance is formed on the fourth layer 6. A second layer 4 is subsequently formed on the third layer 5 using a third substance having high hole transport properties.

Next, the first layer 3 is formed on the second layer 4 by the vapor codeposition of a first substance having electron transport properties, and a second substance having electron-donating properties with respect to the first substance, and the upper portion anode 2 is formed on the first layer 3 by IZO sputtering to produce the organic electroluminescence element.

In such a configuration, positive voltage is applied to the upper portion anode 2 and negative voltage is applied to the pixel cathode 8 from a power source E, whereby electric current flows in the organic electroluminescence layer, and the organic electroluminescence element emits light.

The thickness of each layer is as follows: the anode 2 composed of IZO is about 70 nm, the first layer 3 is about 40 nm, the second layer 4 is about 40 nm, the third layer (light-emitting layer) 5 is about 40 nm, the fourth layer 6 is about 10 nm, the layer 7 is about 20 nm, and the pixel cathode 8 is about 200 nm.

Embodiment 3

Figure 3:
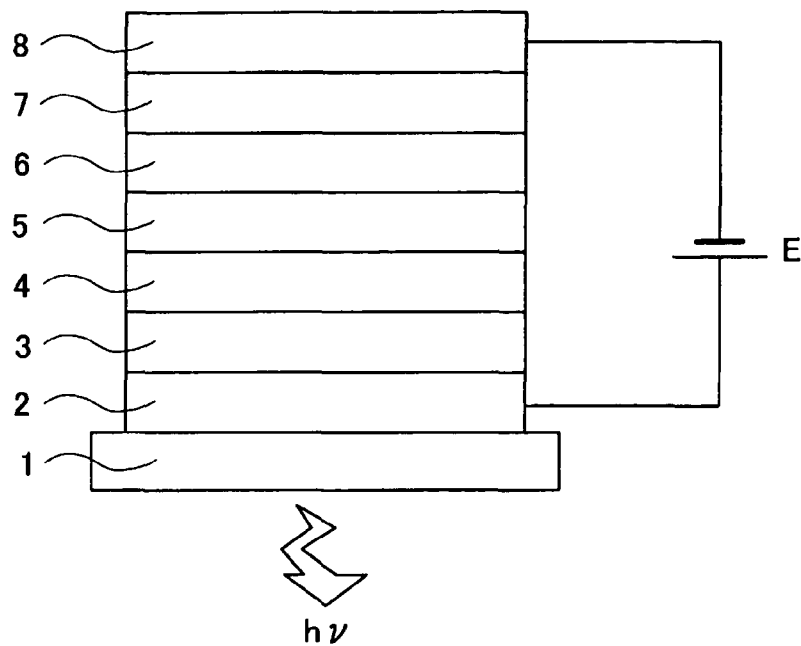
FIG. 3 is a partial enlarged cross-sectional view showing the configuration of the organic electroluminescence element for describing embodiment 3 of the organic electroluminescence display device according to the present invention.

FIG. 3 is a partial enlarged cross-sectional view showing the configuration of the organic electroluminescence element for describing the embodiment 3 of the organic electroluminescence display device according to the present invention. The same reference numerals are used for the same parts as in the drawings described above, and a description thereof will be omitted. In FIG. 3, a first layer 3 which has electron transport properties and electron-donating properties and in which a first substance having electron transport properties, and a second substance having electron-donating properties with respect to the first substance, have been codeposited is formed on a pixel anode 2, which is composed of vapor-deposited ITO (In—Ti—O) connected to a thin-film transistor for driving the organic electroluminescence element disposed on a glass substrate 1.

A second layer 4 is subsequently formed on the first layer 3 using a third substance having high hole transport properties, a third layer 5 containing a light-emitting substance is formed on the second layer 4, a fourth layer 6 is formed by vapor-depositing an electron transport material on the third layer 5, a layer 7 having the same configuration as the first layer is formed on the fourth layer 6, and an upper portion cathode 8 is formed on the layer 7 by vapor-depositing Al to produce the organic electroluminescence element.

In this configuration, positive voltage is applied to the pixel anode 2 and negative voltage is applied to the upper portion cathode 8 from a power source E, whereby electric current flows and the organic electroluminescence element emits light.

The thickness of each layer is as follows: the pixel anode 2 composed of ITO is about 70 nm, the first layer 3 is about 20 nm, the second layer 4 is about 60 nm, the third layer (light-emitting layer) 5 is about 40 nm, the fourth layer 6 is about 10 nm, the layer 7 is about 20 nm, and the upper portion cathode 8 composed of Al is about 200 nm.

Embodiment 4

Figure 4:
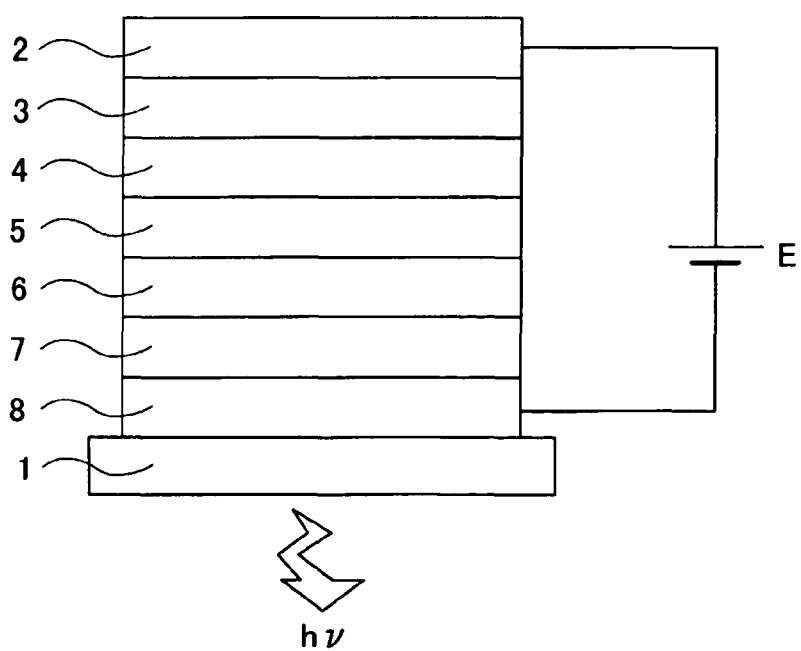
FIG. 4 is a partial enlarged cross-sectional view showing the configuration of the organic electroluminescence element for describing embodiment 4 of the organic electroluminescence display device according to the present invention.

FIG. 4 is a partial enlarged cross-sectional view showing the configuration of the organic electroluminescence element for describing the embodiment 4 of the organic electroluminescence display device according to the present invention. The same reference numerals are used for the same parts as in the drawings described above, and a description thereof will be omitted. In FIG. 4, a layer 7 which has electron transport properties, and electron-donating properties and in which a first substance having electron transport properties, and a second substance having electron-donating properties with respect to the first substance, have been codeposited is formed on a pixel cathode 8, which is composed of ITO connected to a thin-film transistor for driving the organic electroluminescence element disposed on a glass substrate 1.

A fourth layer 6 is subsequently formed by vapor-depositing an electron transport material on the layer 7, a third layer (light-emitting layer) 5 containing a light-emitting substance is formed on the fourth layer 6, a second layer 4 is formed on the third layer 5 using a third substance having high hole transport properties, a first layer 3 is formed on the second layer 4 by the vapor codeposition of a first substance having electron transport properties, and a second substance having electron-donating properties with respect to the first substance, and an upper portion anode 2 is formed on the first layer 3 by vapor-depositing Al to produce the organic electroluminescence element.

In such a configuration, negative voltage is applied to the pixel cathode 8, and positive voltage is applied to the upper portion anode 2 from a power source E, whereby electric current flows and the organic electroluminescence element emits light.

The thickness of each layer is as follows: the upper portion anode 2 is about 200 nm, the first layer 3 is about 20 nm, the second layer 4 is about 50 nm, the third layer 5 is about 60 nm, the fourth layer 6 is about 10 nm, the layer 7 is about 40 nm, and the pixel cathode 8 is about 70 nm.

Comparative Example 1

Figure 5:
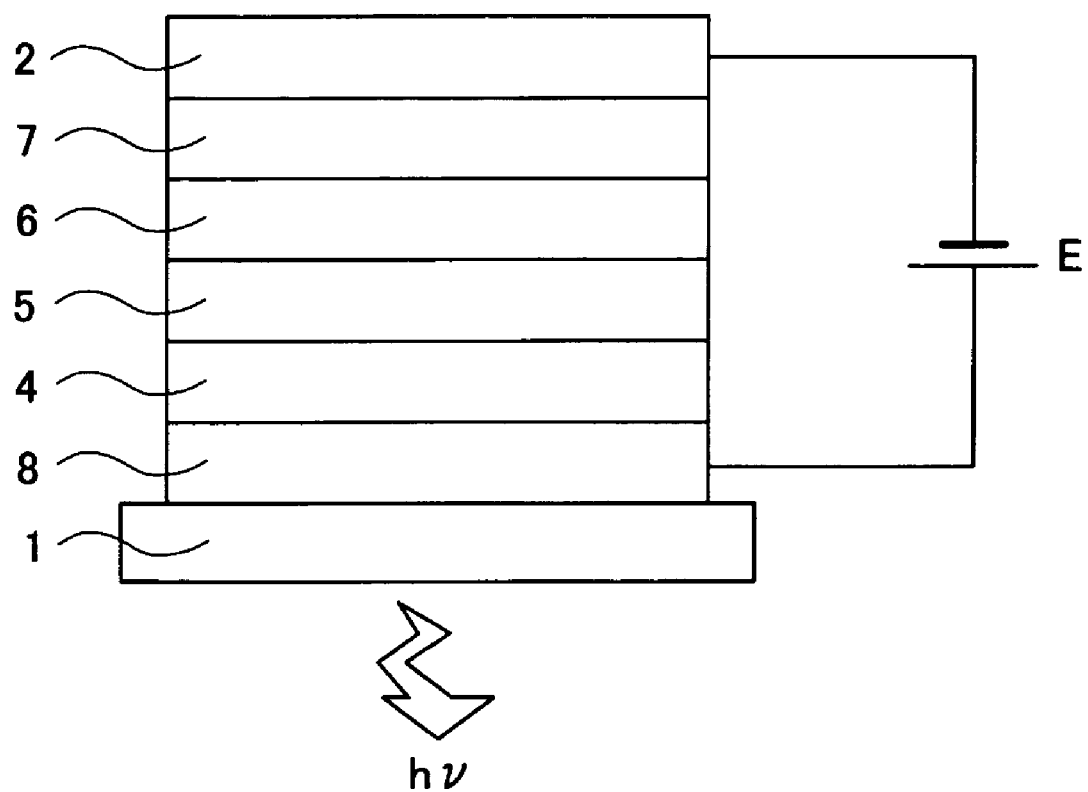
FIG. 5 is a partial enlarged cross-sectional view showing the configuration of the organic electroluminescence element for describing comparative example 1 as a conventional technique.

FIG. 5 is a partial enlarged cross-sectional view showing the configuration of the organic electroluminescence element for describing the comparative example 1 as a conventional technique. The same reference numerals are used for the same parts as in the drawings described above, and a description thereof will be omitted. In FIG. 5, a second layer 4 is formed using a third substance having hole transport properties on a pixel anode electrode 8, which is composed of ITO connected to a thin-film transistor for driving the organic electroluminescence element disposed on a glass substrate 1, a third layer 5 containing a light-emitting substance is formed on the second layer 4, a fourth layer 6 is formed on the third layer 5 by vapor-depositing a material having electron transport properties, a layer 7 having the same configuration as the first layer 3 described above is formed on the fourth layer 6, and an upper portion cathode 2 is formed by vapor-depositing Al to produce the organic electroluminescence element. This configuration is a conventional structure, and the first layer 3 described above is not included.

In such a configuration, positive voltage is applied to the pixel cathode 8 and negative voltage is applied to the upper portion anode 2 from a power source E, whereby electric current flows in the light-emitting layer 5 and the organic electroluminescence element emits light.

The thickness of each layer is as follows: the pixel anode 8 is about 70 nm, the first layer 3 is omitted, the second layer 4 is about 80 nm, the third layer (light-emitting layer) 5 is about 40 nm, the layer 6 is about 10 nm, the layer 7 is about 20 nm, and the upper portion cathode 2 is about 200 nm.

Figure 6:
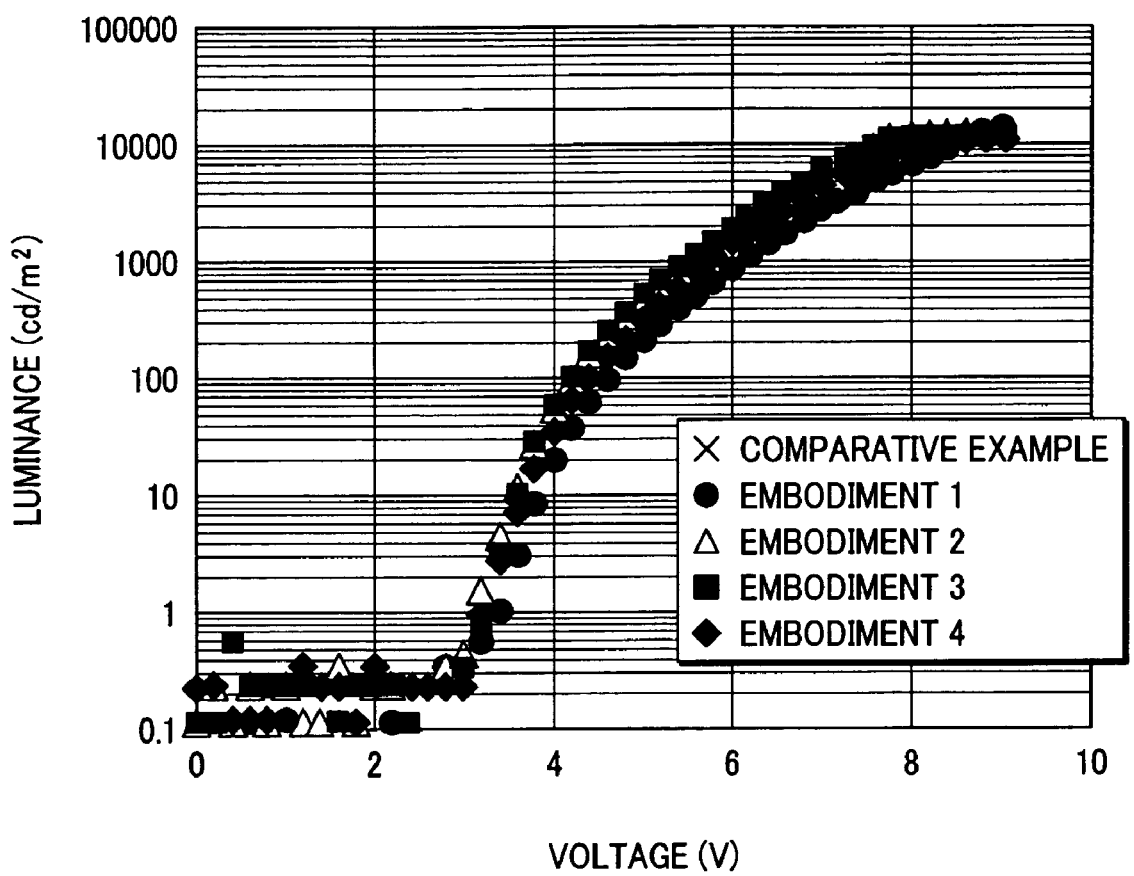
FIG. 6 is a view showing the luminance-voltage characteristic of comparative example 1 and the embodiments of the organic electroluminescence display device according to the present invention.

In FIG. 6, luminance-voltage characteristics are exhibited when tris (5-methyl-8-quinolinato) aluminum is used as the first substance and cesium is used as the second substance, $V_2O_5$ and aromatic tertiary amine are layered to a thickness of about 55 nm as the third substance, a carbazole derivative is used as the host of third layer (light-emitting layer) 5, and an iridium complex is used as the dopant.

Figure 7:
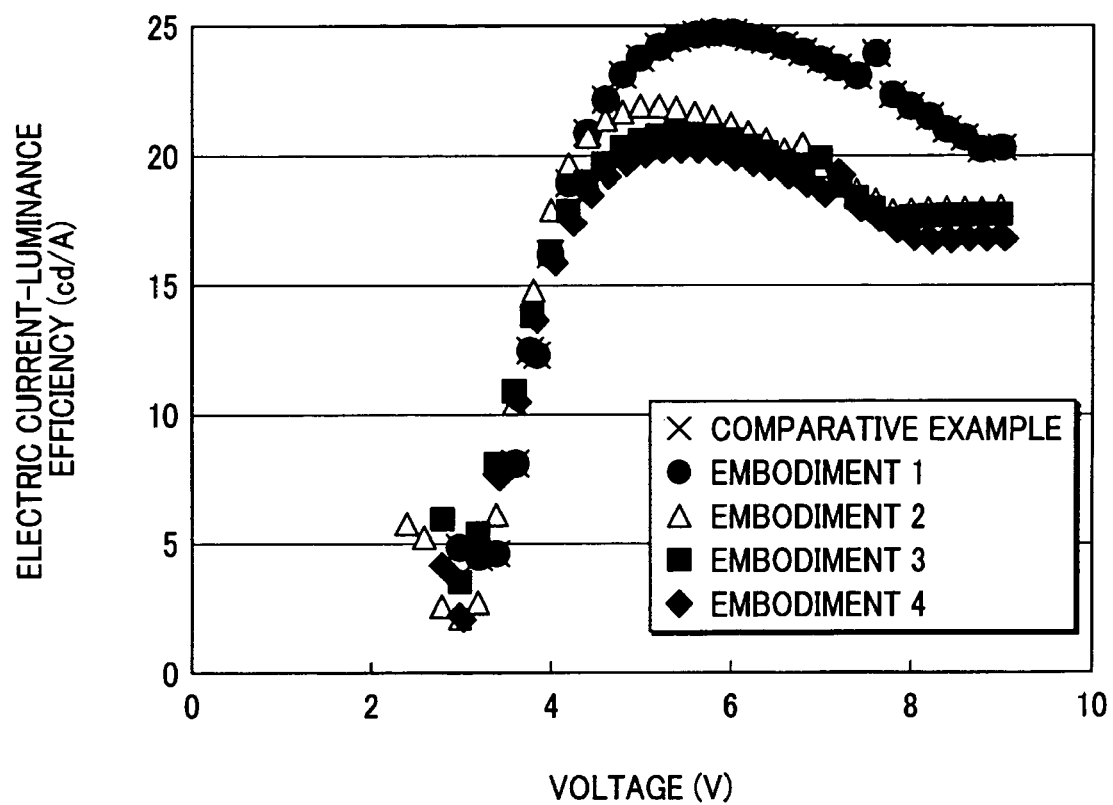
FIG. 7 is a view showing the electric current-luminance efficiency of comparative example 1 and the embodiments of the organic electroluminescence display device according to the present invention.
Figure 8:
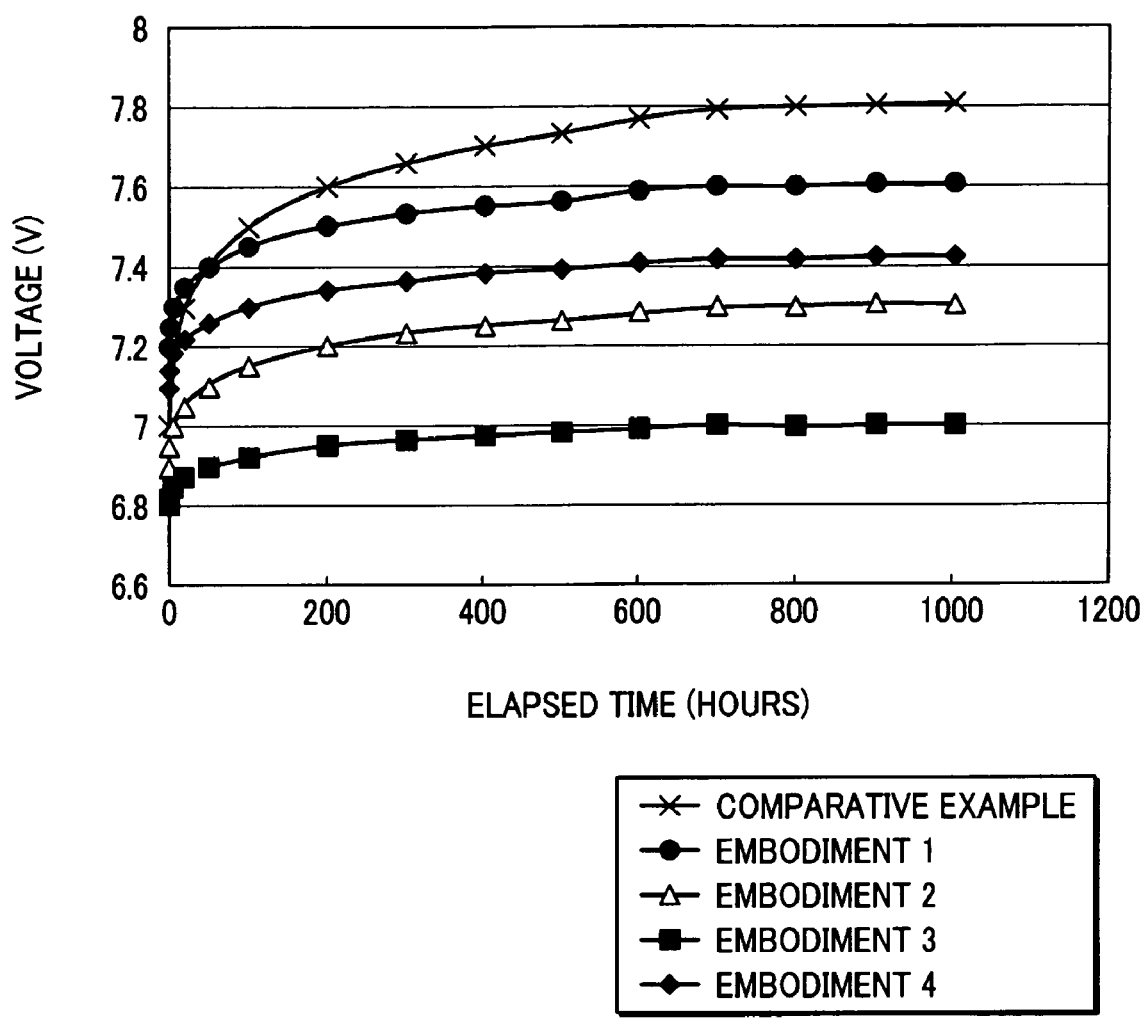
FIG. 8 is a view showing the voltage variance of comparative example 1 and the embodiments of the organic electroluminescence display device according to the present invention when lighted for a long period of time.

FIG. 7 shows the electric current-luminance efficiency-voltage characteristic of the embodiments and the comparative example described above. FIG. 8 shows the voltage variance of the embodiments and the comparative example described above when the organic electroluminescence element is lighted for a long period of time at an electrical current density of about 20 $mA/cm^2$ and a temperature of about 40° C.

The first layer 3 was formed by vapor codeposition as a layer containing the second substance in a weight ratio of about 20% with respect to the first substance. The third layer (light-emitting layer) 5 was formed by vapor codeposition so that the dopant had a weight ratio of about 2% with respect to the host.

It is apparent from FIGS. 6 to 8 that the increase in voltage when the organic electroluminescence element was lighted for a long period of time was apparently less in comparison with comparative example 1, and the effect of the present invention is apparent.

In accordance with the embodiments described above, an organic electroluminescence element having a stable electro-optical conversion characteristic and no dependence on slight variation in work function of the pixel electrode of the third layer (light-emitting layer) 5 can be formed on the glass substrate 1 provided with a thin-film transistor for driving the organic electroluminescence, and a beautiful image without color irregularities can be obtained.

Additionally, a highly reliable organic electroluminescence element can be obtained because the voltage increase that accompanies the light emission of the third layer 5 for a long period of time is reduced. Also, a vapor codeposition layer composed of a low-resistance electron transport material and an alkali metal can be disposed on the hole transport side, and short-circuiting between the electrodes caused by the unevenness of the electrode surfaces can be prevented by increasing film thickness. Furthermore, the hue of the drawn-out light can be adjusted by the interference effect of light because the distance between the electrode and the light-emitting surface can be regulated without an accompanying increase in the resistance.

Additionally, an organic electroluminescence display device in which an organic electroluminescence element is mounted was described in the embodiments above, but the configuration of the present embodiment can also be generally applied to TVs, PC monitors, notebook PCs, PDAs, mobile phones, digital still cameras, digital video cameras, car navigation monitors, and other devices in which an electroluminescence EL element is mounted.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescence display device having an organic electroluminescence element that is provided with an anode electrode, an organic electroluminescence layer having at least a four-layer structure formed on the anode electrode, and a cathode electrode formed on the organic electroluminescence layer, the organic electroluminescence element comprising:
    a first layer that is in direct contact with the anode electrode and contains a first substance that exhibits electron transport properties, and a second substance that exhibits electron-donating properties with respect to the first substance;
    a second layer that is in contact with the first layer and contains a third substance that exhibits hole transport properties;
    a third layer that is in contact with the second layer and contains a light-emitting substance;
    a fourth layer that is in direct contact with the third layer and contains a substance that exhibits electron transport properties; and
    a fifth layer disposed between the cathode electrode and the fourth layer and containing a same substance as the first layer.

2. The organic electroluminescence display device of claim 1, wherein the fifth layer contains an element of the first group of the periodic table, and wherein the fifth layer is disposed between the cathode electrode and the fourth layer.

3. The organic electroluminescence display device of claim 1, wherein the fifth layer contains an element of the second group of the periodic table, and wherein the fifth layer is disposed between the cathode electrode and the fourth layer.

4. The organic electroluminescence display device of claim 1, wherein the anode electrode is in contact with an insulating substrate.

5. The organic electroluminescence display device of claim 1, wherein the cathode electrode is in contact with an insulating substrate.

6. The organic electroluminescence display device of claim 1, wherein at least one electrode among the anode electrode and the cathode electrode is formed using a transparent conductive substance.

* * * * *